United States Patent
Chang et al.

(10) Patent No.: US 8,445,311 B2
(45) Date of Patent: May 21, 2013

(54) METHOD OF FABRICATING A DIFFERENTIAL DOPED SOLAR CELL

(75) Inventors: Chi-Hsiung Chang, Hukou Township, Hsinchu County (TW); Kuan-Lun Chang, Hukou Township, Hsinchu County (TW); Hung-Yi Chang, Hukou Township, Hsinchu County (TW); Yi-Min Pan, Hukou Township, Hsinchu County (TW); Jun-Min Wu, Hukou Township, Hsinchu County (TW); Ying-Yen Chiu, Hukou Township, Hsinchu County (TW)

(73) Assignee: Big Sun Energy Technology Incorporation, Hsinchu County (TW)

( * ) Notice: Subject to any disclaimer, the term of this patent is extended or adjusted under 35 U.S.C. 154(b) by 0 days.

(21) Appl. No.: 13/303,126

(22) Filed: Nov. 22, 2011

(65) Prior Publication Data

US 2012/0164779 A1    Jun. 28, 2012

(30) Foreign Application Priority Data

Dec. 22, 2010  (TW) ................................ 99145205 A

(51) Int. Cl.
*H01L 21/00*    (2006.01)

(52) U.S. Cl.
USPC .............................. 438/78; 438/69

(58) Field of Classification Search
USPC .......................................... 438/71
See application file for complete search history.

(56) References Cited

U.S. PATENT DOCUMENTS

| 2010/0147378 A1* | 6/2010 | Lee et al. ........................ 136/256 |
| 2011/0114152 A1* | 5/2011 | Zaks et al. ..................... 136/244 |
| 2011/0140226 A1* | 6/2011 | Jin et al. ......................... 257/460 |

* cited by examiner

*Primary Examiner* — Charles Garber
*Assistant Examiner* — Calvin Choi
(74) *Attorney, Agent, or Firm* — Chun-Ming Shih; HDLS IPR Services

(57) ABSTRACT

A method of fabricating a differential doped solar cell is provided. The method comprises the steps of (a) providing a light doped semiconductor substrate; (b) forming a heavy doped layer having the same type of dopant used in step (a) on a front surface of the semiconductor substrate; and (c) forming an emitter layer having a different type of dopant used in step (a) on a surface of the heavy doped layer to constitute a p-n junction with the heavy doped layer.

10 Claims, 5 Drawing Sheets

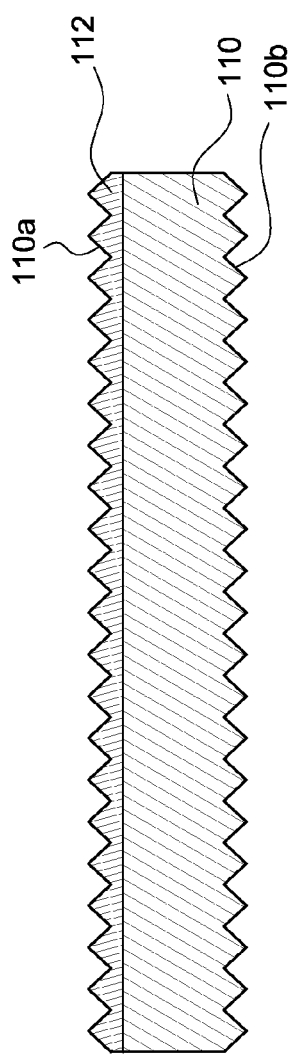
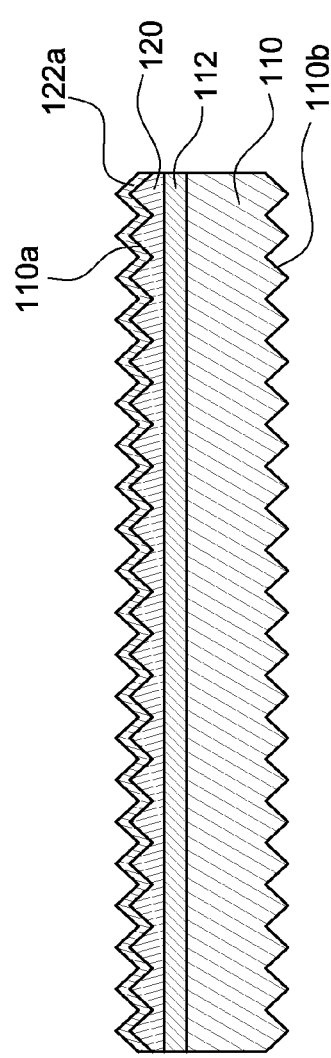

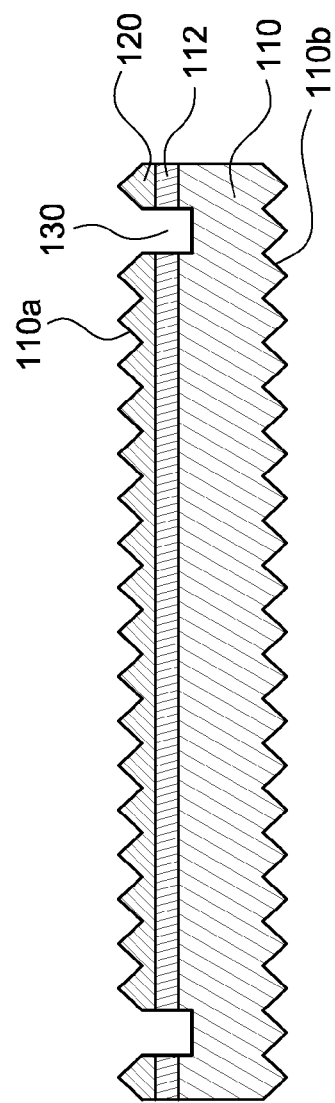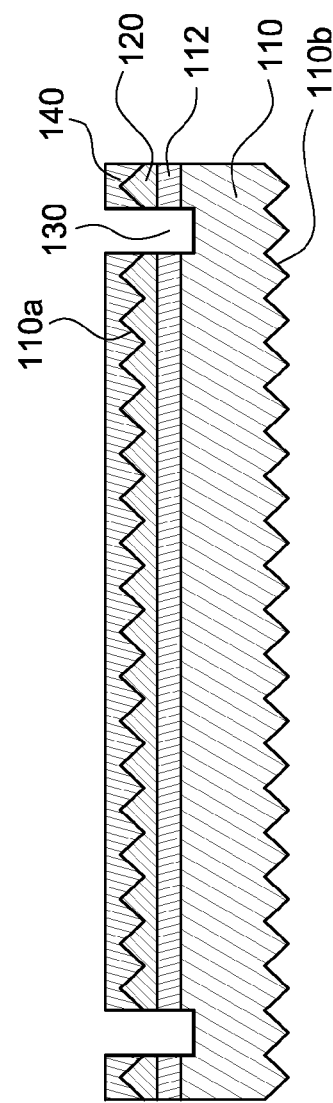

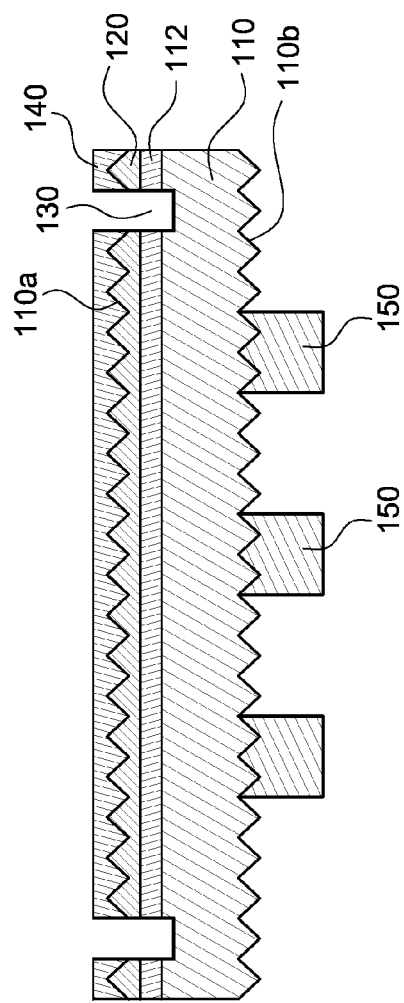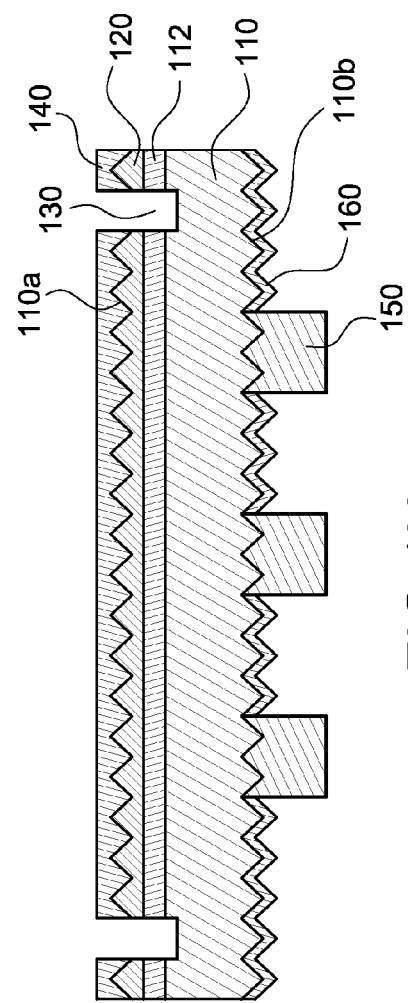

METHOD OF FABRICATING A DIFFERENTIAL DOPED SOLAR CELL

BACKGROUND OF THE INVENTION

1. Field of the Invention

This invention generally relates to a method of fabricating a solar cell, and in particular to a method of fabricating a differential doped solar cell.

2. Description of the Related Art

In recent years, new forms of renewable energy are of much interest due to problems, such as rising oil prices, global warming, exhaustion of fossil energy, nuclear waste disposal and site selection involved in construction of a new power plant. Among others, research and development into solar cells, which directly converts solar energy into electric energy and is a pollution-free energy, has actively progressed.

The solar cell design in widespread use today has a p-n junction formed near the front surface (that surface which receives the light) which creates an electron flow as light energy is absorbed in the cell. The conventional solar cell design has two electrical contacts formed on the front and rear sides, respectively. In a typical photovoltaic module these individual solar cells are interconnected electrically in series to increase the voltage in order to provide power for electrical appliances which is driven by a large voltage.

The conventional solar cell fabrication may use a p-type semiconductor substrate and then form a thin n-type semiconductor layer on the p-type semiconductor substrate by a high temperature thermal diffusion. Prior to the high temperature thermal diffusion, a texturing structure is formed on the front surface of the semiconductor substrate and an anti-reflection layer is applied to reduce the reflection of incident light. Next, a screen-printing process is performed. Ag paste and Al paste may be screen-printed and dried on the front surface and the rear surface of the semiconductor substrate according to a predetermined pattern by a screen-printed machine. Next, a co-firing process is performed. The Ag paste and Al paste formed on the front surface and the rear surface of the semiconductor substrate are fired through a high temperature sintering furnace so that the Ag paste and Al paste may form a eutectical structure on the corresponding surface of the semiconductor substrate for ohmic contact. Accordingly, the electrical electrodes may be formed on the surfaces of the semiconductor substrate, and a solar cell with simple structure is completed.

For the cost consideration, in fabrication of solar cell, a p-type semiconductor substrate is doped with boron, particularly heavy doped with boron in order to reduce the sheet resistance of the emitter layer. However, it will produce relative open circuit voltage degradation under illumination (luminous decay). Under illumination, a boron atom may combine two oxygen atoms in the semiconductor substrate to become an occurring position of recombination of carriers, reducing short circuit current and decreasing the efficiency of the solar cell.

The inventor used and determined two kinds of samples, which are different concentration of boron-doped substrates with different sheet resistance in order to confirm that the above phenomenon of luminous decay should increase as the addition amount of boron in the substrate. The results are shown in tables 1 and 2. Table 1 shows data of cell outdoor exposure of single cell using a heavy doped boron substrate with sheet resistance of 0.5~3.0 Ω/sq (Sample Nos. Pcs-01 to Pcs-04). Table 2 shows data of cell outdoor exposure of single cell using a light doped boron substrate with sheet resistance of 3.0~6.0 Ω/sq (Sample Nos. Pcs-01 to Pcs-04). In tables 1 and 2, the value of cell outdoor exposure is the photoelectric conversion rate of the samples in unit of percentage (%). The specific value of 5 kWh/M2 in the column of "after exposure" represents an overall luminous amount to which the photoelectric conversion rate reduces most sharply, and beyond the specific value the downward trend of the photoelectric conversion rate will significantly slow down and stabilize. In tables 1 and 2, the last column indicates the luminous decay of single cells with Samples Nos. Pcs-01 to Pcs-04, and in the bottom of the last column indicates average decay rates of 1.47(%) and 0.69(%) from which it is obvious the luminous decay of single cells using the substrate with sheet resistance of 0.5~3.0 Ω/sq is greater than that of 3.0~6.0 Ω/sq.

TABLE 1

(sheet resistance of 0.5~3.0 Ω/sq)

| Sample No. | before exposure (%) | After exposure (5 kWh/M2) (%) | Decay rate (%) |
|---|---|---|---|
| Pcs-01 | 17.83 | 17.62 | 1.18 |
| Pcs-02 | 18.09 | 17.87 | 1.22 |
| Pcs-03 | 18.05 | 17.73 | 1.77 |
| Pcs-04 | 18.18 | 17.87 | 1.71 |
|  |  | Average decay rate | 1.47 |

TABLE 2

(sheet resistance of 3.0~6.0 Ω/sq)

| Sample No. | before exposure (%) | After exposure (5 kWh/M2) (%) | Decay rate (%) |
|---|---|---|---|
| Pcs-01 | 18.02 | 17.91 | 0.61 |
| Pcs-02 | 18.06 | 17.90 | 0.89 |
| Pcs-03 | 18.02 | 17.96 | 0.33 |
| Pcs-04 | 18.14 | 17.97 | 0.94 |
|  |  | Average decay rate | 0.69 |

Therefore, the inventor conducted researches according to the scientific approach in order to improve and resolve the above drawback, and finally proposed the present invention, which is reasonable and effective.

SUMMARY OF THE INVENTION

It is an object of present invention to provide a method of fabricating a differential doped solar cell that not only may reduce luminous decay but also may reduce the sheet resistance of the emitter layer and increase open circuit voltage.

In order to achieve the above object, there is provided a method of fabricating a differential doped solar cell of the present invention, comprising the steps of (a) providing a light doped semiconductor substrate; (b) forming a heavy doped layer having the same type of dopant used in step (a) on a front surface of the semiconductor substrate; and (c) forming an emitter layer having a different type of dopant used in step (a) on a surface of the heavy doped layer to constitute a p-n junction with the heavy doped layer.

In one aspect, the method of fabricating a differential doped solar cell of the present invention providing the light doped semiconductor substrate is a p-type silicon substrate and the emitter layer is an n-type emitter layer. The light doped semiconductor substrate may be doped with boron, for example. The light doped semiconductor substrate may has sheet resistance of 3.0~6.0 Ω/sq. The heavy doped layer may has sheet resistance of 0.5~3.0 Ω/sq.

In the aspect, there may further comprise a step of forming a texturing structure on a surface of the light doped semiconductor substrate following the step (a). There may further comprise a step of removing a phosphosilicate glass layer which is formed on the emitter layer following the step (c). There may further comprises a step of laser edge isolation of cutting a groove having a depth that exceeds the level of the p-n junction along the edge of the semiconductor substrate by a laser beams following the step (c). There may further comprise a step of forming a passivation layer on the emitter layer following the step (c). There may further comprise steps of forming a rear surface electrical conductive paste, a rear surface metal paste and a front surface electrical conductive paste following the step (c).

As stated above, the invention provides a method of fabricating a differential doped solar cell comprising the steps of: providing a light doped boron semiconductor substrate; forming a heavy doped boron layer on a front surface of the semiconductor substrate; and forming an emitter layer having a different type of dopant such as phosphorus on a surface of the heavy doped layer to constitute a p-n junction with the heavy doped layer. Accordingly, the present invention provides a method of fabricating a differential doped solar cell, which not only may reduce luminous decay but also may reduce the sheet resistance of the emitter layer and increase open circuit voltage. Therefore, the overall conversion efficiency of solar cell can be enhanced.

The present specification contains a sufficiently clear and complete disclosure of contents of the invention so as to enable person skilled in the art to understand the contents thereof and to practice said invention. Also, the manner for disclosing the contents, the claims and the drawings according to the specification of the invention can enable person skilled in the art easily to understand the purposes and advantages. Therefore, the detailed features and advantages of the invention are described in the following detailed description of the invention.

BRIEF DESCRIPTION OF THE DRAWINGS

FIGS. 1A to 1I show schematically drawn step sequential cross section structures obtained in a process according to a preferred embodiment of the present invention.

DETAILED DESCRIPTION OF THE PREFERRED EMBODIMENT

A detailed description of a method of fabricating a differential doped solar cell of the invention will be described below. FIGS. 1A to 1I show schematically drawn step sequential cross section structures obtained in a process according to a preferred embodiment of the present invention. Please refer to FIG. 1A. In the embodiment, a semiconductor substrate 110 having a front surface 110a and a rear surface 110b is provided first. The semiconductor substrate 110 may be a high-purity silicon substrate doped with group 111A elements of periodic table such as boron (B) to form a p-type semiconductor substrate. It should be noted, the semiconductor substrate 110 is lightly doped with boron, having a sheet resistance of 3.0~6.0 Ω/sq.

Figure 1A:
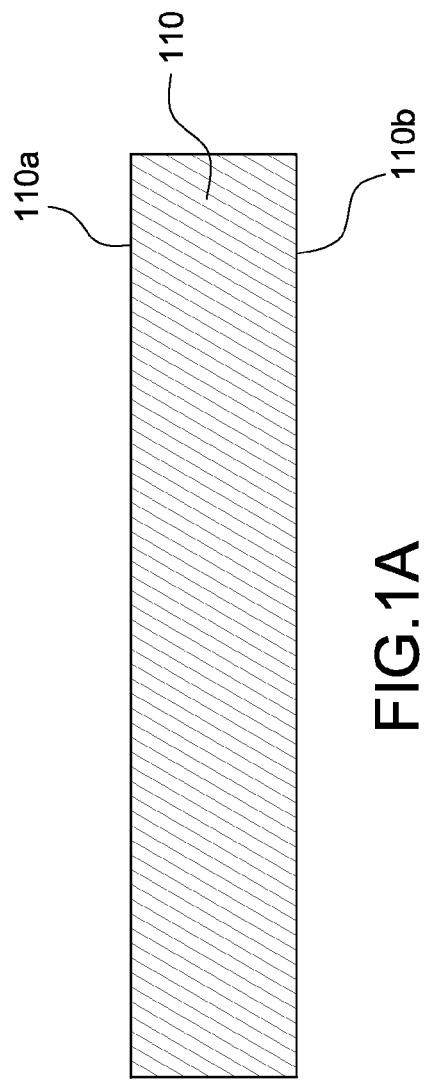
Figure 1B:
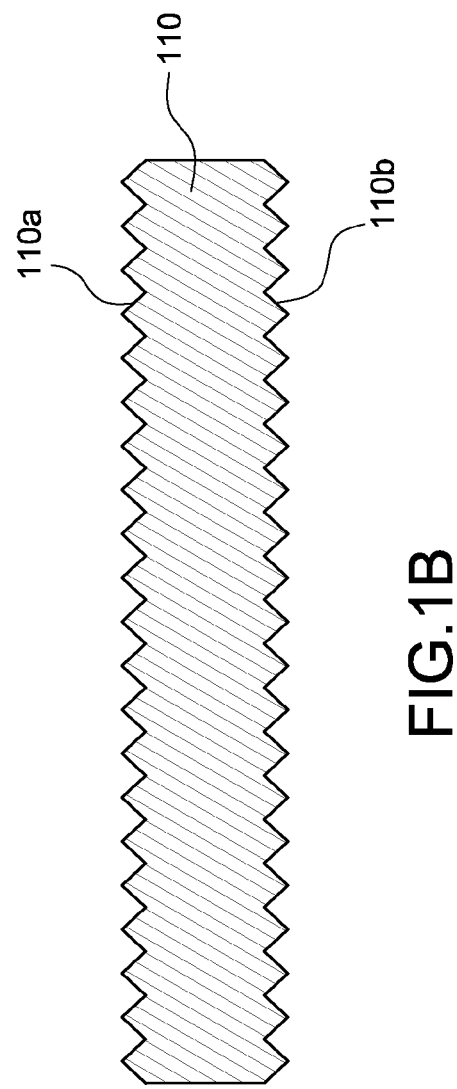

Next, as shown in FIG. 1B, the semiconductor substrate is cleaned to remove the dust on the surface of wafer by using alkaline solution such as NaOH aqueous solution or KOH aqueous solution. The effect of cleaning depends on the concentration of aqueous solution, cleaning time and heating temperature. Next, a texturing process of wafer surface is performed. The front surface 110a and the rear surface 110b of the semiconductor substrate 110 are etched into a texture-like structure (texture) to reduce the light reflectance.

Next, as shown in FIG. 1C, in order to reduce the luminous decay phenomena, the semiconductor substrate 110 is lightly doped with boron, having the sheet resistance of 3.0~6.0 Ω/sq. However, the semiconductor substrate 110 with lightly-doped boron is not conducive enough to forming p-n junction with high-performance due to a high sheet resistance from a low boron-containing semiconductor substrate 100. In the embodiment, in order to reduce the sheet resistance of emitter layer and increase short-circuit current, before the formation of emitter layer (see element numeral 120 of FIG. 1D), a heavily doped with boron is performed to form a heavy doped layer 112 having the same type of dopant such as boron on the front surface 110a of the semiconductor substrate 110. In the embodiment, the heavy doped layer 112 has sheet resistance of 0.5~3.0 Ω/sq. Therefore, the present invention provides a method of fabricating a differential doped solar cell, which not only may reduce luminous decay but also may reduce the sheet resistance of the emitter layer and increase open circuit voltage.

Next, please refer to FIG. D. An emitter layer 120 doped with group VA elements of periodic table is formed on a surface of the heavy doped layer 112, and a p-n junction is formed between the emitter layer 120 and the heavy doped layer 112, i.e., a phosphorous diffusion process (forming p-n junction) is performed on the semiconductor substrate 110. In the embodiment, the phosphorous diffusion process performed on the semiconductor substrate 110 is providing the semiconductor substrate 110 in a deposition room, using phosphorous oxychloride (POCl3) of gaseous source to form a deposition on the semiconductor substrate 110, and diffusing phosphorous ions of phosphorous oxychloride into the inside of the semiconductor substrate 110 by a high temperature thermal oxidation of the deposition process.

Specifically, the phosphorous diffusion process is performing a deposition process to form a phosphosilicate glass layer 122a on the front surface 110a of the semiconductor substrate 110 immediately after the semiconductor substrate 110 is provided in a deposition room. The phosphorous ions of the phosphosilicate glass layer 122a will diffuse into the inside of the front surface 110a of the semiconductor substrate 110 to form an emitter layer 120, i.e., an n-type emitter layer by the high temperature of the deposition room when the deposition process is performed. Accordingly, a p-n junction is formed between the emitter layer 120 and the heavy doped layer 112.

After the phosphorous diffusion process is completed, the phosphosilicate glass layer 122a of the semiconductor substrate 110 is removed and a laser edge isolation process is performed. As shown in FIG. 1E, cutting a groove 130 has a depth that exceeds the level of the p-n junction along the edge of the semiconductor substrate 110 by a laser beams.

Next, please refer to FIG. 1F. A passivation layer 140 is formed on the emitter layer 120 of the semiconductor substrate 110. The passivation layer 140 can use materials, such as SiNx, SiO2, amorphous silicon or aluminum oxide that are formed by a plasma enhanced chemical vapor deposition (PECVD). The passivation layer 140 can reduce the reflection of sunlight to enhance the rate of absorption of sunlight. Also, the passivation layer 140 has the effect of hydrogen passivation that can reduce recombination loss of carriers on the surface of the semiconductor substrate 110 in a solar cell to enhance the open-circuit voltage.

Next, please refer to FIG. 1G. A rear surface electrical conductive paste 150 is formed on the rear surface 110b of the semiconductor substrate 110. For example, the rear surface electrical conductive paste 150 such as Ag paste or Ag—Al paste is coated on the rear surface 110b of the semiconductor substrate 110 to form rear bus bars by a screen-printing process.

Next, please refer to FIG. 1H. A metal paste 160 is formed on the rear surface 110b of the semiconductor substrate 110. For example, the metal paste 160 such as aluminum (Al) paste or aluminum silver (Ag—Al) paste is coated on the rear surface 110b of the semiconductor substrate 110 to form back surface field (BSF) layer by a screen-printing process. A typical solar cell has a rear surface coated with a metal paste. After sintering, the metal paste 160 may form a eutectical structure on the rear surface 110b. The Al—Si eutectical structure of the rear surface 110b may produce BSF to enhance the carriers collection of solar cell and pick up the photons that are not absorbed as the solar cell receives the sunlight. Accordingly, the conversion efficiency of solar cell can be improved.

Figure 1I:
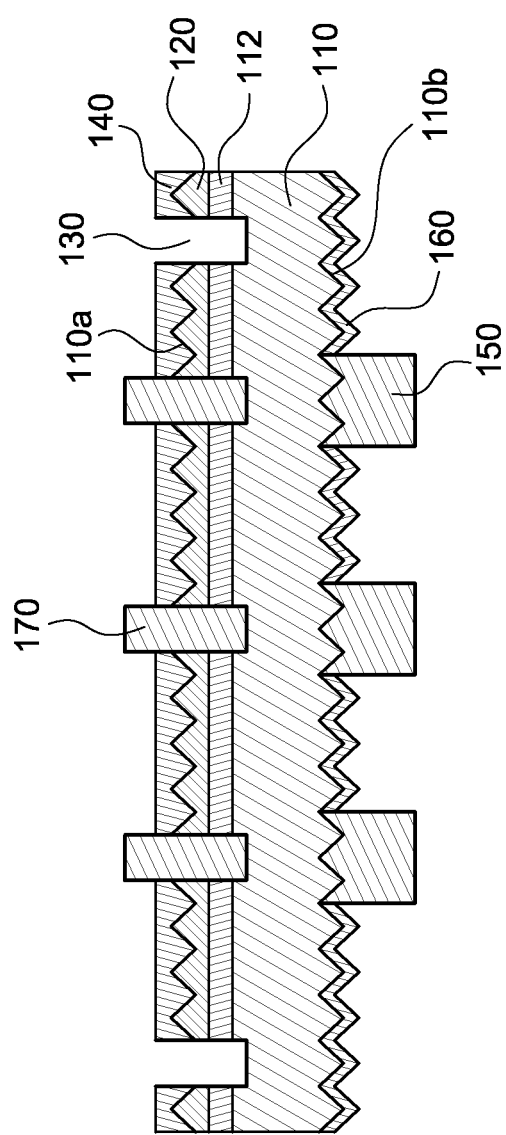

Next, please refer to FIG. 1I. A front surface electrical conductive paste 170 is formed on the passivation layer 140. For example, the front surface electrical conductive paste 170 such as Ag paste or Ag—Al paste is coated on the passivation layer 140 to form front bus bars and finger electrodes by a screen-printing process.

There will be a drying process respectively following the rear surface electrical conductive paste 150, the screen-printed metal paste 160 or the front surface electrical conductive paste 170 is finished.

Finally, a high temperature sintering process is performed to sinter the semiconductor substrate 110. The electrodes are formed by sintering the rear surface electrical conductive paste 150, the screen-printed metal paste 160 and the front surface electrical conductive paste 170. The sintering temperature of sintering the semiconductor substrate 110 is 500 to 900° C.

As stated above, the invention provides a method of fabricating a differential doped solar cell comprising the steps of: providing a light doped boron semiconductor substrate; forming a heavy doped boron layer on a front surface of the semiconductor substrate; and forming an emitter layer having a different type of dopant such as phosphorus on a surface of the heavy doped layer to constitute a p-n junction with the heavy doped layer. Accordingly, the present invention provides a method of fabricating a differential doped solar cell, which not only may reduce luminous decay but also may reduce the sheet resistance of the emitter layer and increase open circuit voltage. Therefore, the overall conversion efficiency of solar cell can be enhanced.

Although the present invention has been described with reference to the foregoing preferred embodiment, it will be understood that the invention is not limited to the details thereof. Various equivalent variations and modifications can still occur to those skilled in this art in view of the teachings of the present invention. Thus, all such variations and equivalent modifications are also embraced within the scope of the invention as defined in the appended claims.

What is claimed is:

1. A method of fabricating a differential doped solar cell comprising the steps of:
   (a) providing a light doped semiconductor substrate;
   (b) forming a heavy doped layer having the same type of dopant used in step (a) on a front surface of the semiconductor substrate; and
   (c) forming an emitter layer having a different type of dopant used in step (a) on a surface of the heavy doped layer to constitute a p-n junction with the heavy doped layer,
   wherein the light doped semiconductor substrate has sheet resistance of 3.0~6.0 Ω/sq.

2. The method as claimed in claim 1, wherein the light doped semiconductor substrate is a p-type silicon substrate and the emitter layer is an n-type emitter layer.

3. The method as claimed in claim 1, wherein the light doped semiconductor substrate is doped with boron.

4. The method as claimed in claim 1, wherein the heavy doped layer has sheet resistance of 0.5 ~3.0 Ω/sq.

5. The method as claimed in claim 1, further comprising a step of forming a texturing structure on a surface of the light doped semiconductor substrate following the step (a).

6. The method as claimed in claim 1, further comprising a step of removing a phosphosilicate glass layer which is formed on the emitter layer following the step (c).

7. The method as claimed in claim 1, further comprising a step of laser edge isolation of cutting a groove having a depth that exceeds the level of the p-n junction along the edge of the semiconductor substrate by a laser beams following the step (c).

8. The method as claimed in claim 1, further comprising a step of forming a passivation layer on the emitter layer following the step (c).

9. The method as claimed in claim 1, further comprising steps of forming a rear surface electrical conductive paste, a rear surface metal paste and a front surface electrical conductive paste following the step (c).

10. A method of fabricating a differential doped solar cell comprising the steps of:
   (a) providing a light doped semiconductor substrate;
   (b) forming a heavy doped layer having the same type of dopant used in step (a) on a front surface of the semiconductor substrate; and
   (c) forming an emitter layer having a different type of dopant used in step (a) on a surface of the heavy doped layer to constitute a p-n junction with the heavy doped layer,
   wherein the heavy doped layer has sheet resistance of 0.5~3.0 Ω/sq.

* * * * *